United States Patent
Cuijpers et al.

(10) Patent No.: US 6,462,664 B1
(45) Date of Patent: Oct. 8, 2002

(54) BABY MONITOR, SYSTEM, AND METHOD AND CONTROL OF REMOTE DEVICES

(75) Inventors: Maurice Cuijpers, San Jose, CA (US); Jan Van Ee, Cupertino, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/718,051

(22) Filed: Nov. 20, 2000

(51) Int. Cl.⁷ .............................................. G08B 23/00
(52) U.S. Cl. ................ 340/573.1; 340/573.4; 381/94.7
(58) Field of Search .................. 340/539, 571, 340/573.1, 573.3, 573.4; 600/28; 455/412, 550, 568, 569; 381/94.1, 94.7

(56) References Cited

U.S. PATENT DOCUMENTS

| | | | |
|---|---|---|---|
| 5,128,987 A | | 7/1992 | McDonough et al. |
| 5,666,331 A | * | 9/1997 | Kollin .................. 368/245 |
| 5,737,433 A | * | 4/1998 | Gardner ................ 381/94.7 |
| 5,991,637 A | * | 11/1999 | Mack, II et al. ........ 455/550 |
| 6,104,334 A | * | 8/2000 | Allport ............... 340/825.24 |
| 6,154,548 A | | 11/2000 | Bizzan |

FOREIGN PATENT DOCUMENTS

JP 2000125027 4/2000

* cited by examiner

*Primary Examiner*—Van Trieu
(74) *Attorney, Agent, or Firm*—Kevin Fortin

(57) ABSTRACT

A baby monitor system incorporated into a receiver of the baby monitor circuitry that can remotely control an electric or electronic device when the output sound level of the receiver reaches a reference level. The control can be by infrared, radio frequency or hardwire transmission of a volume control command to the electric or electronic device. By incorporating this control system into the baby monitor, a parent is ensured to hear sounds of a baby.

4 Claims, 5 Drawing Sheets

BABY MONITOR, SYSTEM, AND METHOD AND CONTROL OF REMOTE DEVICES

BACKGROUND OF THE INVENTION

1. Field of the Invention

The present invention relates to a baby monitor, and more particularly to a baby monitor capable of controlling other devices. The baby monitor is capable of muting a television or other electronic device.

2. Description of the Related Art

Baby monitors are well known. A standard baby monitor consists of a transmitter and a receiver, each of which can be powered by a battery or an A/C current source (usually with an inline transformer). The transmitter contains a microphone or other sound detecting device and is placed in a location near a baby. The receiver contains a speaker and placed in a location near a parent. A sound (e.g. a stirring or crying baby) detected by the transmitter is transmitted to the receiver for output to the parent to hear and respond to accordingly.

Several versions of this standard model exist. One includes a plurality of light emitting diodes (LEDs), which light in series to indicate the level of the sound received by the receiver. This acts as a visual alert for the parent in that as the sound level increases the number of LEDs that light also increases. As an added alert the color of the subsequently lit or higher sound-level LEDs is a different color from the lower sound-level LEDs (usually red and green, respectively). This visual alert is useful in an environment where there are other noises that may cause the receiver output to go unheard by the parent. These other noises can be sound from a television, radio, stereo, or other electronic device, that outputs the sound from a speaker. These external noises can also be from noise-making electric appliances, for example, an electric mixer, a blender, a washing machine, or the like.

In either of the above models, if the external noises are greater that the output of the baby monitor receiver, the sounds of the baby can go unheard by the parent. And a problem with the LED model in particular arises when external noises are present and the receiver is out of the line-of-sight of the parent. In this case, along with the sound going unheard, the visual alert goes unseen. Thus, in either case the baby could be crying and the parent would be unaware of this potentially dangerous situation.

The present invention solves this long-standing problem and provides a baby monitor that can insure that the parent hears the sounds under a variety of external noise conditions.

SUMMARY OF THE INVENTION

It is an aspect of the present invention to provide a baby monitor receiver that can control the volume level of other electronic devices.

It is another aspect of the present invention to incorporate into the receiver of the baby monitor a control circuit that detects the sound level and, upon reaching a predetermined or user-set level, decreases or mutes the volume of another electronic device.

It is yet another aspect of the present invention to control any electric noise-making device by incorporating an A/C control module into the present invention.

These and other aspects of the present invention can be achieved by incorporating into a receiver of a baby monitor a system that can remotely control an electric or electronic device when the output sound level of the receiver reaches a reference level. The control can be by infrared, radio frequency or hardwire transmission of a volume control command to the electric or electronic device. By incorporating this control system into the baby monitor, a parent is ensured to hear sounds of a baby.

More generally the invention comprises a monitor system, comprising a sound detector, a transmitter coupled to the sound detector for transmitting a signal upon said detector detecting a sound, and a control device that receives the signal and supplies a control signal to at least one device remote from the control device. A network can be interposed between the transmitter and the control device, wherein the network can be the Internet.

The invention also comprises a method of monitoring a location, comprising the steps of detecting a sound, transmitting a signal upon detecting said sound, and controlling at least one device via said transmitted signal.

The invention also comprises a method of enabling a user to monitor a location. By detecting a sound, transmitting to said user a signal upon detecting said sound, and controlling at least one device via said transmitted signal, the user can monitor a location.

The invention further comprises software for a home network for processing an audio signal received from a sound detector, and controlling at least one device remote from the home network.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF INVENTION

Preferred embodiments of the present invention will be described herein below with reference to the accompanying drawings. In the following description, well-known functions or constructions are not described in detail since they would obscure the invention in unnecessary detail.

Figure 1:
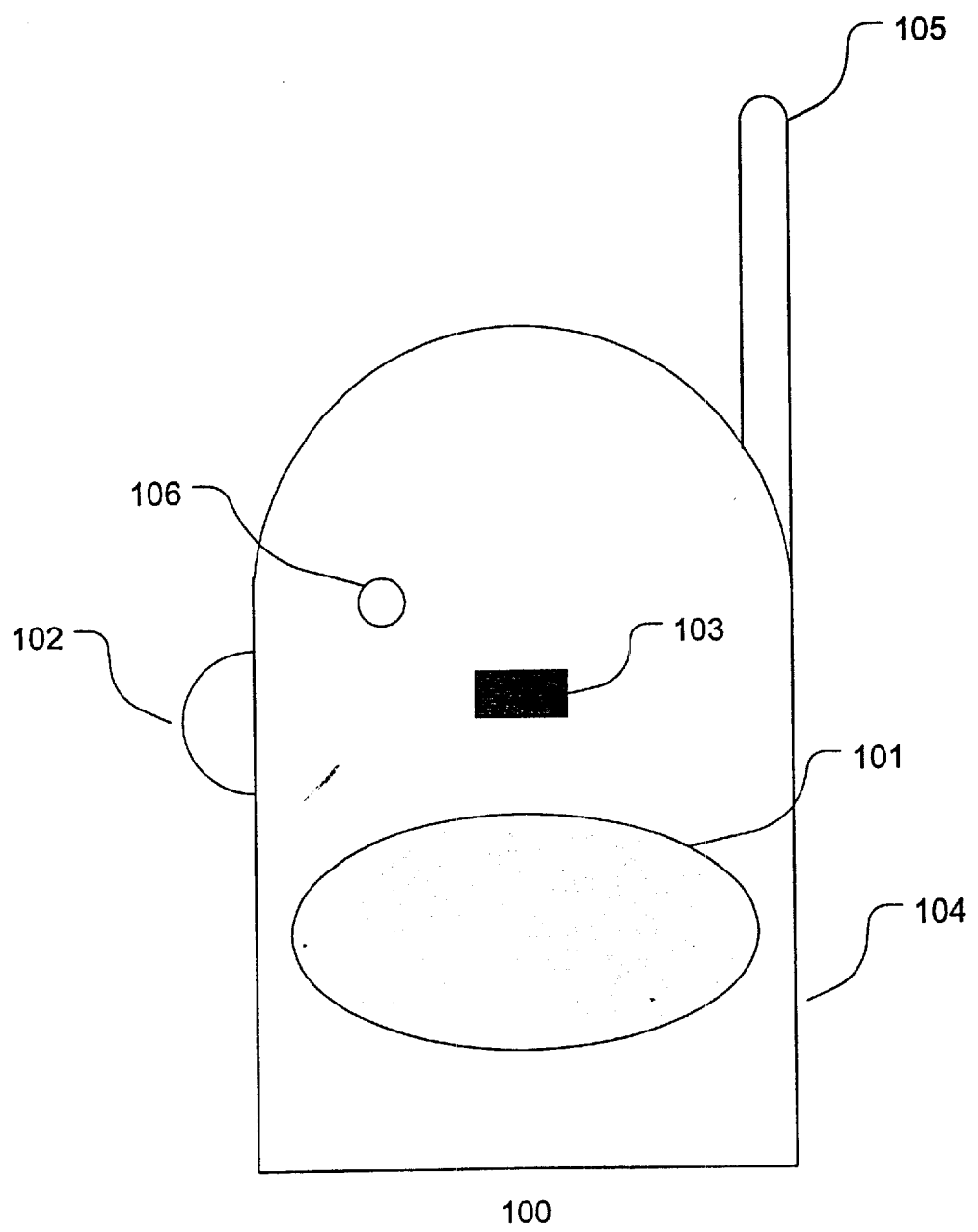
FIG. 1 is a front view of a baby monitor receiver according to an embodiment of the present invention.

As depicted in FIG. 1, a preferred embodiment of the baby monitor receiver 100 comprises a main body 104 and an antenna 105. Incorporated into the main body 104 is a speaker grating 101 to allow the sound output from an internal speaker (not shown) to pass through the main body 104. An ON/OFF-volume variable resistor dial 102 is located the side of the main body 104 to control the power to and the volume of the receiver. A power indicator light 106 is positioned on the front of the main body 104 to indicate a "power on" state of the receiver 100. An infrared (IR) window 103 is located on the front of main body 104 to allow IR signals to be transmitted to and from the internal circuitry of the receiver (not shown).

Figure 2:
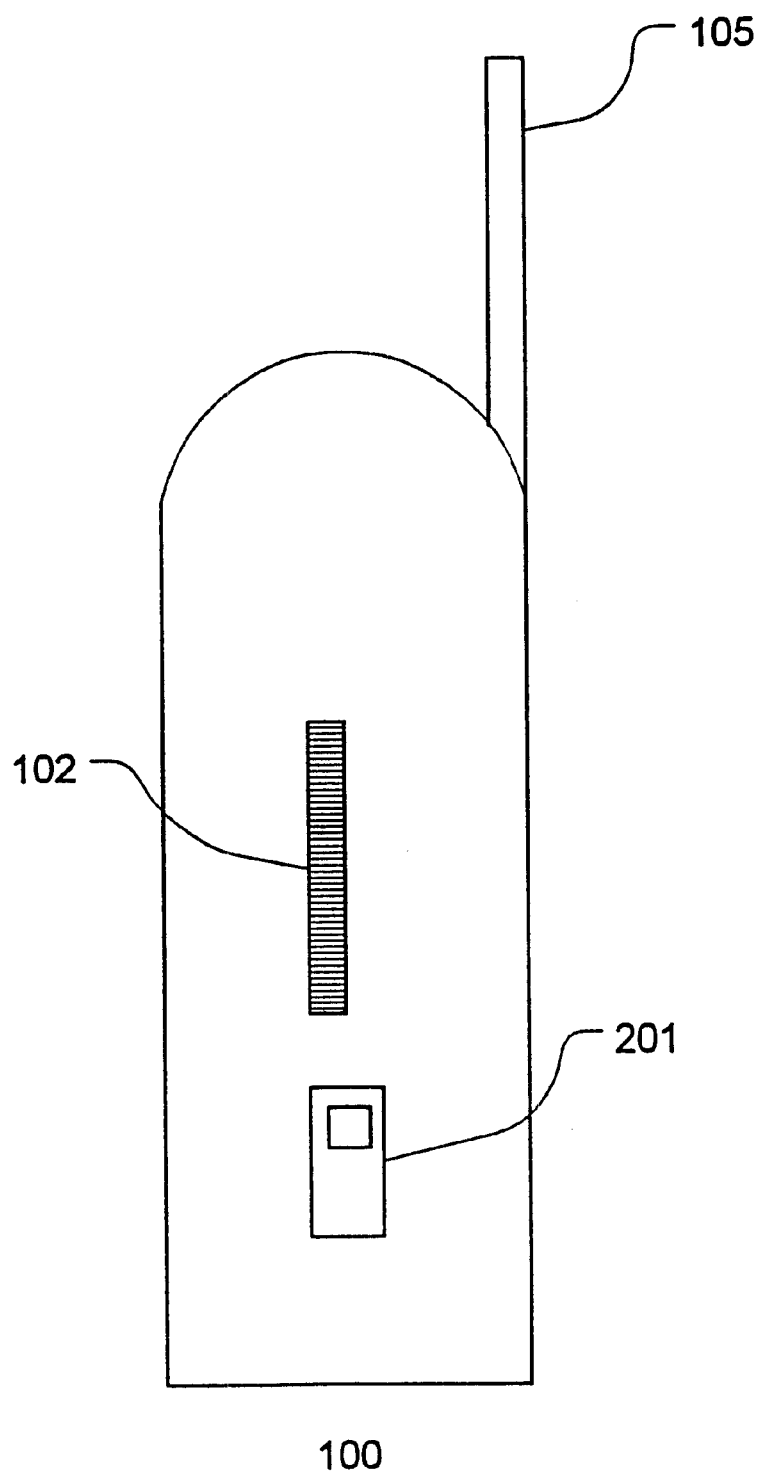
FIG. 2 is a side view of the baby monitor receiver depicted in FIG. 1 according to an embodiment of the present invention.

FIG. 2 is a side view of the baby monitor receiver 100 of FIG. 1. Depicted in FIG. 2 is slide switch 201. Slide switch 201 is preferably a two-position slide switch. A first position of the slide switch 201 places the monitor into a normal operating mode and a second position of the slide switch 201 places the monitor into a learn mode. When in the learn mode the monitor, according to one embodiment of the present invention, can be programmed to control a particular electric or electronic device, as described below.

Figure 3:
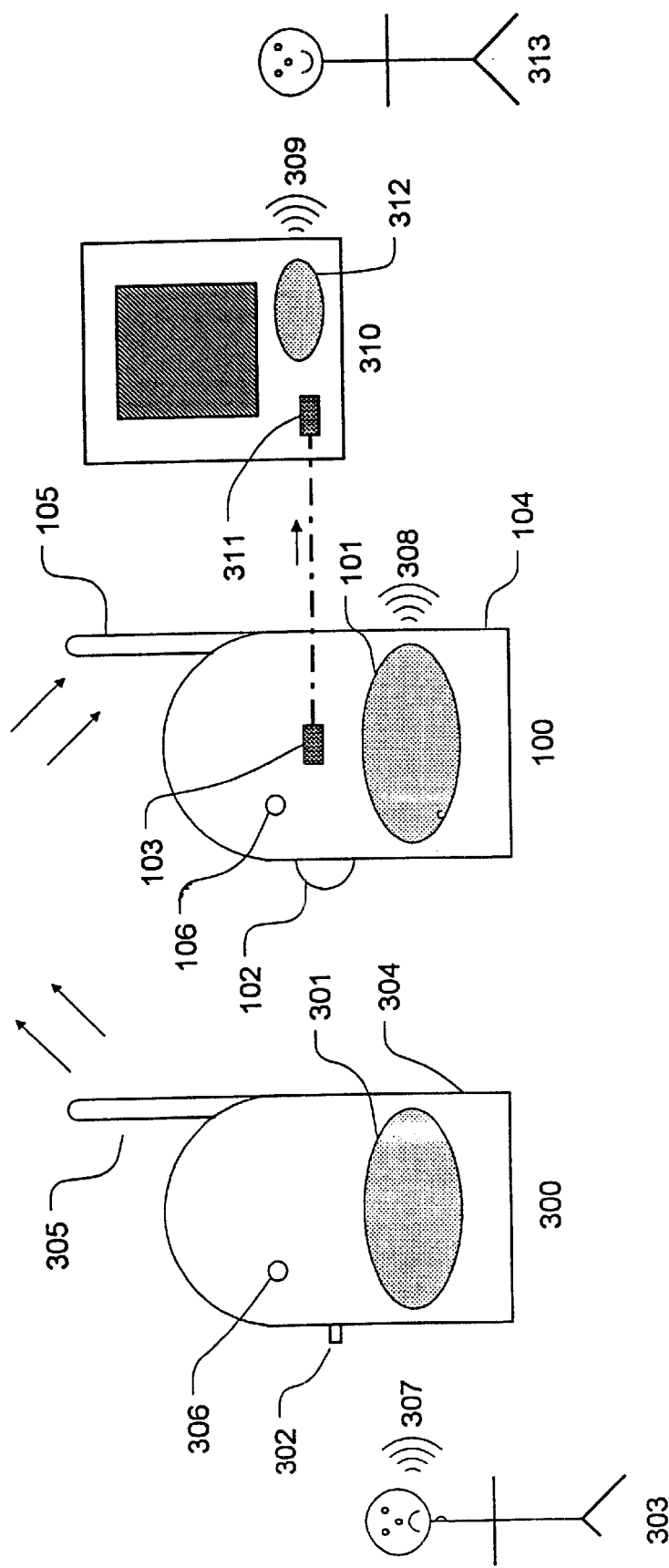
FIG. 3 is a block diagram of a baby monitor system according to an embodiment of the present invention.

FIG. 3 is a block diagram of a baby monitor system according to an embodiment of the present invention. Referring to FIG. 3, the system allows a parent 313 to monitor a baby 303, and comprises a transmitter 300, the receiver 100, and a remote device to be controlled, shown here as television 310, the operation of which is as follows. The transmitter 300 comprises a sound grating 301 to allow sound to pass through transmitter main body 304 to a microphone or other sound-detecting device (not shown) inside the transmitter 300, an ON/OFF switch 302 to control the power to the transmitter, an antenna 305, and a power indicator light 306. When the baby 303 makes sounds 307 the microphone (not shown) inside the transmitter 300 detects the sound 307 and transmits it out through antenna 305. Receiver 100 receives the sound through antenna 105 where it is processed. The sound 308 is output through the speaker (not shown) inside the receiver 100 through the speaker grating 101. If noise 309 output from the television 310 is at a level higher than the sound 308 output from the receiver 100, the parent 313 will not hear it and will be unaware of the cry of the baby 303.

The received sound is also processed by control circuitry internal to the receiver 100, described in detail below with respect to FIG. 4. Upon detecting a sound level greater than a stored reference level, the receiver 100 transmits an IR command signal through window 103. The IR command is received by television 310 through IR window 311, where the internal circuitry of the television 310 processes the command signal and mutes the sound 309 coming from speaker 312 of television 310, thus alerting parent 313 and allowing parent 313 to hear the output sound 308 of the receiver 100.

Figure 4:
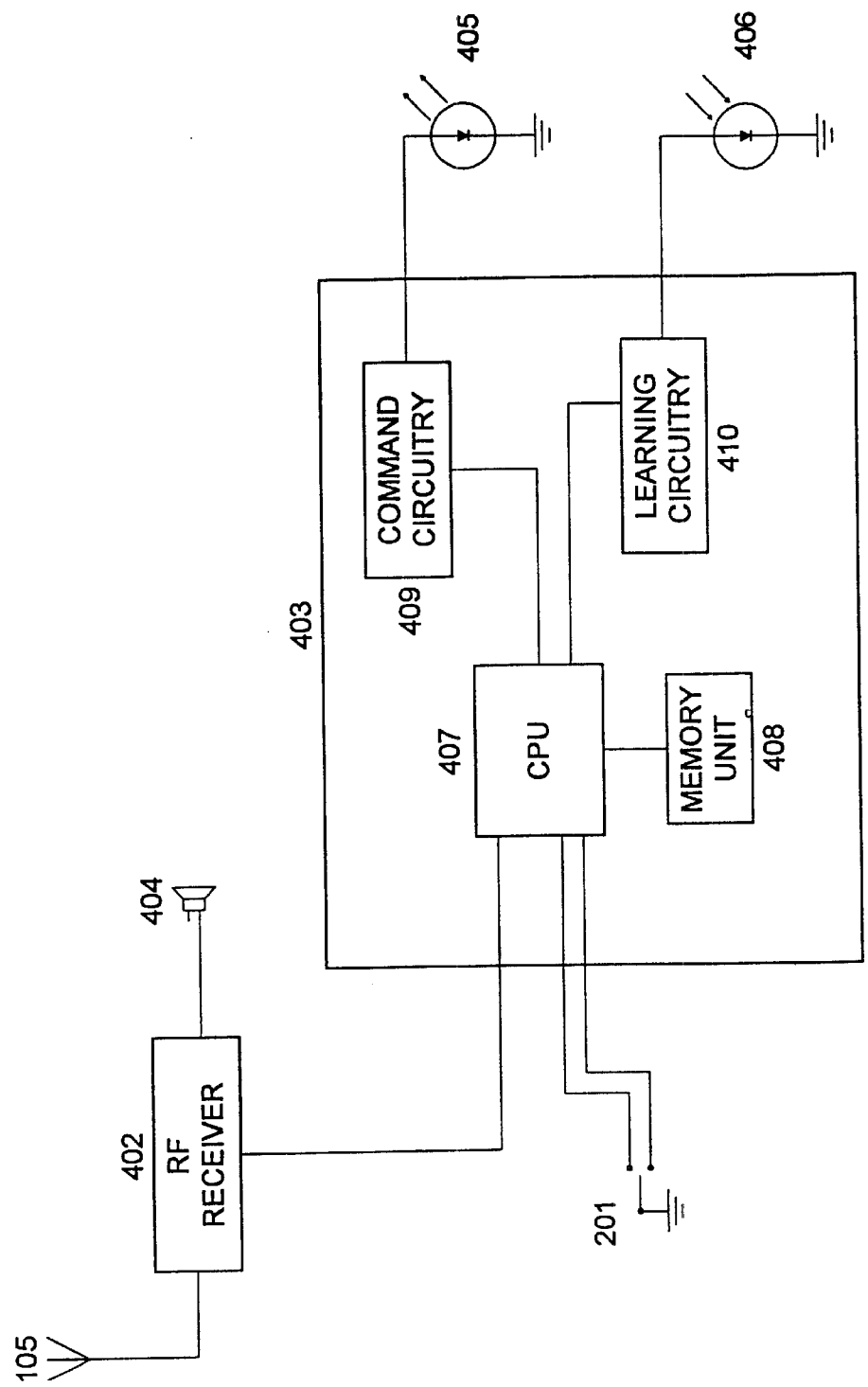
FIG. 4 is a block diagram of the baby monitor receiver according to an embodiment of the present invention.

FIG. 4 is a block diagram of the baby monitor receiver 100 according to an embodiment of the present invention. As shown in FIG. 4 the baby monitor receiver comprises the antenna 105 connected to an RF receiver 402. The transmitter 300 (not shown) detects sound 307 and transmits the sound to the baby monitor receiver 100. A signal transmitted from the transmitter 300 is received by the antenna 105 and processed by the RF receiver 402. The RF receiver is connected to a speaker 404. The sound 309 is output through speaker 404.

The signal received at antenna 105 is also forwarded to control circuitry 403. When the slide switch 201 is in the normal operating mode (e.g. position 1), a central processing unit (CPU) 407 of the control circuitry 403 compares the level of the received signal with a reference level stored in a memory unit 408, which can be preset or user-set. If the received signal is less than the reference level the control circuitry 403 does nothing and continues to monitor the received signals, while the sound 309 is output through speaker 404. If the received signal is greater than the reference level, the CPU 403 sends a mute command signal stored in memory unit 408 to command circuitry 409, which operates an IR emitter 405, which in turn outputs the IR signal to an electronic device such as a radio, stereo, etc., or the television 310 of FIG. 4.

In the preferred embodiment, which uses IR technology to transmit the mute command, line-of-sight is maintained between the transmitter and electronic device. In another embodiment, an RF signal could be used to transmit the mute command, thus eliminating the line-of-site limitation. And in yet another embodiment the transmitter can be hardwired to the electronic device or even incorporated into the electronic device itself.

Also, the command signal does not have to be limited to a mute command, as it can be any number of other commands, for example, an "off" command, a particular volume level command, or other command to decrease or eliminate the output sound from the device. The invention can also be incorporated into a separate electronic device that is placed in-line with an A/C current for an electric appliance. The baby monitor receiver would transmit an "off" command and upon receipt of the "off" command the electronic device would disconnect power to the appliance, eliminating the noise generated thereby.

Referring again to FIG. 4., when slide switch 201 is in the learn mode (e.g. position 2), the control circuitry 403 enters into a learn mode to store or program a mute command code particular to the electronic device sought to be controlled. The control circuitry 403 contains the memory unit 408 to store one or more commands depending on the particular embodiment of the present invention. The memory unit 408 can be preprogrammed to control a particular electronic device, an embodiment which would not require the slide switch 201 as no learn mode would be required by the user. The memory unit 408 can also be user-programmable to allow for the storage of one or more commands and to control one or more devices.

When the slide switch 201 is moved from position 1 to position 2 the monitor 100 enters into the learn mode. The CPU 407 activates learning circuitry 410 to receive a command input through an IR detector 406. The command to be stored or learned is input by pointing an IR emitter of a remote control of a remote device (not shown) at the IR detector 406 and pressing a button on the remote control corresponding to the command the user desires to store in the monitor. The CPU 407 accepts the command signal from the learning circuitry 410 and stores the command in the memory unit 408. Various additional programming methods are well known in the art and are not included herein.

Figure 5:
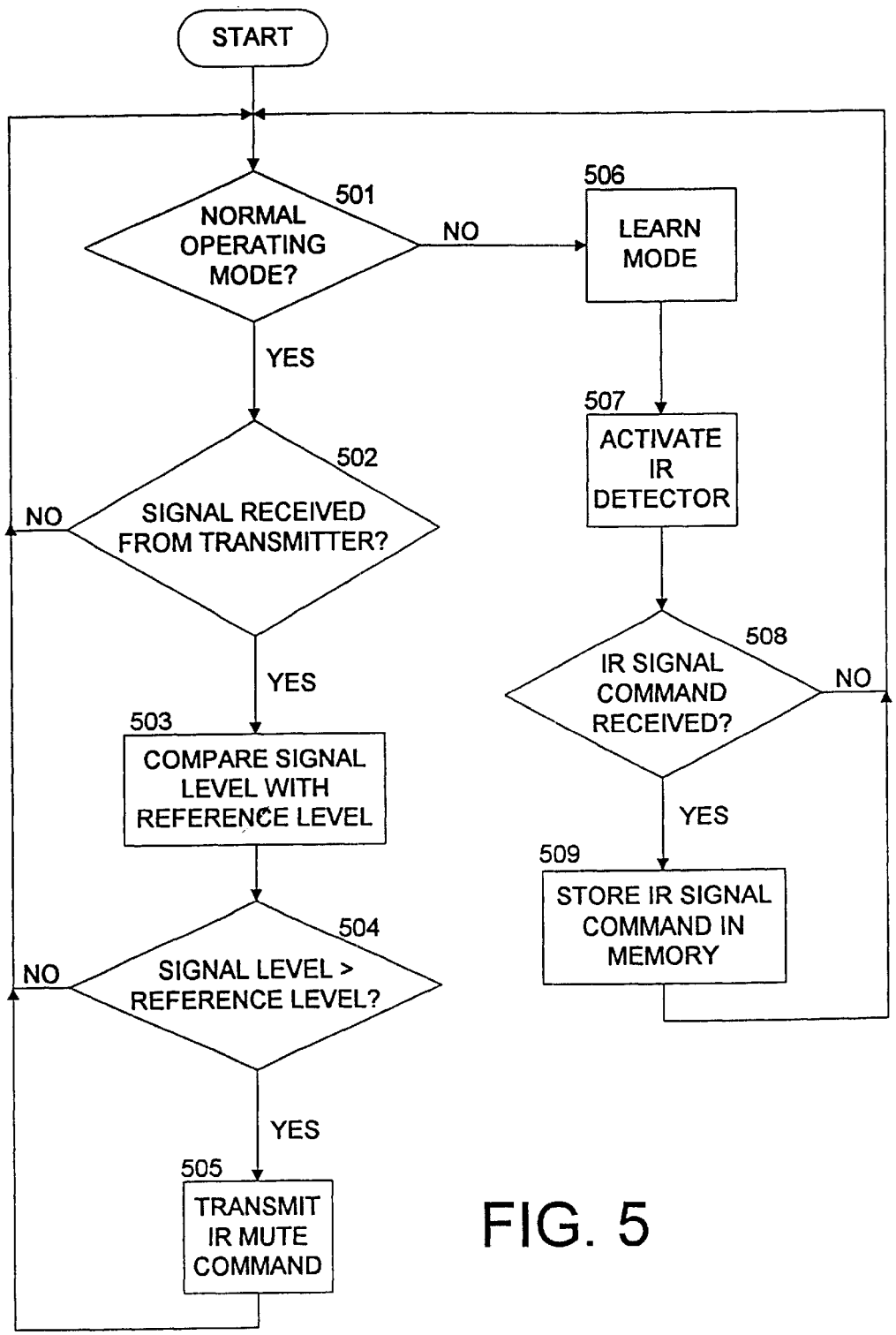
FIG. 5 is an operational flow chart of the baby monitor receiver according to an embodiment of the present invention.

FIG. 5 is an operational flow chart of the baby monitor receiver according to an embodiment of the present invention. When the power of the baby monitor receiver 100 is turned on, the CPU 407 in step 501 checks to determine if the receiver is in normal operating mode. If the receiver 100 is in normal operating mode, the system in step 502 waits for a signal to be received from the transmitter 300. If no signal is received, the system returns to the start to wait for a received signal. If a signal is received, the system in step 503 outputs the sound through the speaker 404 and the CPU 407 compares the level of the received signal with the reference level stored in memory unit 408. Then in step 504 the CPU 407 determines if the level of the received signal is greater than the reference level. If the level of the received signal is not greater than the reference level, the system returns to step 501. If the level of the received signal is greater than the reference level, the control circuitry 403 in step 505 transmits the stored IR mute command through the command circuitry 409 and IR emitter 405 and returns to step 501.

If in step 501 the CPU 407 determines that the receiver is not in the normal operating mode, the CPU 407 enters in step 506 into the learn mode to store the user-entered commands. In step 507 the CPU 407 activates the IR detector 406. The system then in step 508 checks if an IR signal command is received and if so, the system in step 509 stores the IR signal command in the memory unit 408 and returns to step 501. If no signal command is received in step 508, the system returns to step 501.

Several variations to the above-described system can be implemented that are also included within the scope of the invention. First, the above system can be used to monitor people and things other than a baby. The invention can be utilized to monitor a person who is sick or infirm. Also, the system can be readily modified to monitor an animal or any object where an alert to the user is desired when a sound is produced.

Another modification to the invention relates to the transmitter. Where in the above-described embodiment the receiver compares the received sound to the stored reference signal, the transmitter can perform the comparison and transmit the control signal itself, directly to the controlled device or to a receiver for further transmission. Also, the signal (the sound signal and/or the central signal) can be transmitted via a computer network (including a home computer network), the Internet, etc., which may be interposed at any point between the receiver and the controlled device. Software can be used in a network, for example, to perform the audio and/or signal processing of the transmitter and/or receiver and direct them accordingly.

As for the controlled device itself, the invention is not limited to reducing or muting its volume. For example, when a user is located in a noisy environment, the system can detect the noise level in the environment and amplify a audio signal accordingly, for example the ringing of a telephone, such that the user can hear the audio signal regardless of the noise level in the environment.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A system comprising:

At least one communication means for performing at least the following operations:

receiving a first signal representing a localized medium strength; and transmitting control signals to remote devices; and at least one processor adapted to perform at least the following operations:

Comparing the first signal with a second signal representing an ambient medium strength; and In response to a determination that the localized medium strength is less than the ambient medium strength, supplying a control indication to the communication means to cause transmission of a control signal to effect a change in the ambient medium strength.

2. The system of claim 1, wherein the medium is sound.

3. The system of claim 2, wherein the control indication is a signal which causes a device, remote from the system, to reduce a volume output.

4. The system of claim 1, wherein the control signal is adapted to control at least one of the remote devices to change an output of signals affecting the ambient medium strength.

* * * * *